US008637332B2

(12) United States Patent
Owen et al.

(10) Patent No.: US 8,637,332 B2
(45) Date of Patent: Jan. 28, 2014

(54) MICRO-REFLECTORS ON A SUBSTRATE FOR HIGH-DENSITY LED ARRAY

(75) Inventors: Mark D. Owen, Beaverton, OR (US); Duayne R. Anderson, Saint Helens, OR (US); Thomas R. McNeill, Portland, OR (US); Alexander F. Schreiner, Hillsboro, OR (US)

(73) Assignee: Phoseon Technology, Inc., Hillsboro, OR (US)

( * ) Notice: Subject to any disclaimer, the term of this patent is extended or adjusted under 35 U.S.C. 154(b) by 417 days.

(21) Appl. No.: 12/617,126

(22) Filed: Nov. 12, 2009

(65) Prior Publication Data
US 2010/0052002 A1 Mar. 4, 2010

Related U.S. Application Data

(62) Division of application No. 11/084,466, filed on Mar. 18, 2005, now Pat. No. 7,638,808.

(60) Provisional application No. 60/554,628, filed on Mar. 18, 2004.

(51) Int. Cl.
*H01L 21/00* (2006.01)
(52) U.S. Cl.
USPC .................................. 438/28; 438/29; 438/69
(58) Field of Classification Search
USPC ..................................................... 438/28, 69
See application file for complete search history.

(56) References Cited

U.S. PATENT DOCUMENTS

| | | | |
|---|---|---|---|
| 3,586,959 A | 6/1971 | Eccles et al. | |
| 3,936,686 A | 2/1976 | Moore | |
| 4,011,575 A | 3/1977 | Groves | |
| 4,435,732 A | 3/1984 | Hyatt | |
| 4,530,040 A | 7/1985 | Petterson | |
| 4,544,642 A | 10/1985 | Maeda et al. | |
| 4,595,289 A | 6/1986 | Feldman et al. | |
| 4,684,801 A | 8/1987 | Carroll et al. | |
| 4,734,714 A | 3/1988 | Takasu | |
| 5,003,357 A | 3/1991 | Kim et al. | |
| 5,119,174 A * | 6/1992 | Chen | 257/98 |
| 5,150,623 A | 9/1992 | Woods | |
| 5,195,102 A | 3/1993 | McClean et al. | |

(Continued)

FOREIGN PATENT DOCUMENTS

DE 8815418 2/1989
DE 19619154 A1 6/1997

(Continued)

OTHER PUBLICATIONS

U.S. Patent & Trademark Office International Search Report and Written Opinion for International Application No. PCT/US05/09407, dated Aug. 26, 2005, 11 pages.

(Continued)

*Primary Examiner* — Thien F Tran
(74) *Attorney, Agent, or Firm* — Alleman Hall McCoy Russell & Tuttle LLP

(57) ABSTRACT

The present invention provides an optical array module that includes a plurality of semiconductor devices mounted on a thermal substrate formed with a plurality of openings that function as micro-reflectors, wherein each micro-reflector includes a layer of reflective material to reflect light. Such material preferably is conductive so as to provide electrical connection for its associated semiconductor device.

14 Claims, 7 Drawing Sheets

(56) References Cited

U.S. PATENT DOCUMENTS

| | | | |
|---|---|---|---|
| 5,296,724 A | 3/1994 | Ogata et al. |
| 5,397,867 A | 3/1995 | Demeo |
| 5,418,384 A | 5/1995 | Yamana et al. |
| 5,424,544 A | 6/1995 | Shelton et al. |
| 5,436,710 A | 7/1995 | Uchiyama |
| 5,490,049 A | 2/1996 | Montalan et al. |
| 5,522,225 A | 6/1996 | Eskandari |
| 5,554,849 A | 9/1996 | Gates |
| 5,555,038 A | 9/1996 | Conway |
| 5,609,778 A * | 3/1997 | Pulaski et al. ........... 219/121.69 |
| 5,623,510 A | 4/1997 | Hamilton et al. |
| 5,632,551 A | 5/1997 | Roney et al. |
| 5,660,461 A | 8/1997 | Ignatius et al. |
| 5,698,866 A | 12/1997 | Doiron et al. |
| 5,715,270 A | 2/1998 | Zediker et al. |
| 5,719,589 A | 2/1998 | Norman et al. |
| 5,806,965 A | 9/1998 | Deese |
| 5,857,767 A | 1/1999 | Hochstein |
| 5,877,899 A | 3/1999 | Stern et al. |
| 5,880,828 A | 3/1999 | Nakamura et al. |
| 5,886,313 A | 3/1999 | Krause et al. |
| 5,892,579 A | 4/1999 | Elyasaf et al. |
| 5,910,706 A * | 6/1999 | Stevens et al. ................ 313/498 |
| 6,033,087 A | 3/2000 | Shozo et al. |
| 6,058,012 A | 5/2000 | Cooper et al. |
| 6,065,854 A | 5/2000 | West et al. |
| 6,088,185 A | 7/2000 | Ratliff et al. |
| 6,115,184 A | 9/2000 | Hubble, III et al. |
| 6,118,383 A | 9/2000 | Hegyi |
| 6,141,040 A | 10/2000 | Toh |
| 6,155,699 A | 12/2000 | Miller et al. |
| 6,163,036 A | 12/2000 | Taninaka et al. |
| 6,200,134 B1 | 3/2001 | Kovac et al. |
| 6,252,351 B1 | 6/2001 | Koizumi et al. |
| 6,273,596 B1 | 8/2001 | Parkyn, Jr. |
| 6,290,382 B1 | 9/2001 | Bourn et al. |
| 6,291,839 B1 | 9/2001 | Lester |
| 6,318,886 B1 | 11/2001 | Stopa et al. |
| 6,319,425 B1 | 11/2001 | Tasaki et al. |
| 6,325,524 B1 | 12/2001 | Weber et al. |
| 6,328,456 B1 | 12/2001 | Mize |
| 6,330,017 B1 | 12/2001 | Suzuki |
| 6,346,771 B1 | 2/2002 | Salam |
| 6,357,904 B1 | 3/2002 | Kawashima |
| 6,366,017 B1 | 4/2002 | Antoniadis et al. |
| 6,367,950 B1 | 4/2002 | Yamada et al. |
| 6,373,635 B1 | 4/2002 | Fujimoto et al. |
| 6,375,340 B1 | 4/2002 | Biebl |
| 6,419,384 B1 | 7/2002 | Lewis et al. |
| 6,420,199 B1 | 7/2002 | Coman et al. |
| 6,439,888 B1 | 8/2002 | Boutoussov et al. |
| 6,450,664 B1 | 9/2002 | Kelly |
| 6,457,823 B1 | 10/2002 | Cleary et al. |
| 6,459,919 B1 | 10/2002 | Lys et al. |
| 6,480,389 B1 | 11/2002 | Shie et al. |
| 6,498,355 B1 | 12/2002 | Harrah et al. |
| 6,501,084 B1 | 12/2002 | Sakai et al. |
| 6,525,335 B1 | 2/2003 | Krames et al. |
| 6,534,791 B1 | 3/2003 | Hayashi et al. |
| 6,536,923 B1 | 3/2003 | Merz |
| 6,541,800 B2 | 4/2003 | Barnett et al. |
| 6,545,808 B1 | 4/2003 | Ehbets et al. |
| 6,547,249 B2 | 4/2003 | Collins, III et al. |
| 6,554,451 B1 | 4/2003 | Keuper |
| 6,561,640 B1 | 5/2003 | Young |
| 6,561,808 B2 | 5/2003 | Neuberger |
| 6,573,536 B1 | 6/2003 | Dry |
| 6,577,332 B2 | 6/2003 | Osawa et al. |
| 6,578,986 B2 | 6/2003 | Swaris et al. |
| 6,578,989 B2 | 6/2003 | Osumi et al. |
| 6,607,286 B2 | 8/2003 | West et al. |
| 6,630,689 B2 | 10/2003 | Bhat et al. |
| 6,683,421 B1 | 1/2004 | Kennedy et al. |
| 6,686,581 B2 | 2/2004 | Verhoeckx et al. |
| 6,692,250 B1 | 2/2004 | Decaudin et al. |
| 6,708,501 B1 | 3/2004 | Ghoshal et al. |
| 6,724,473 B2 | 4/2004 | Leong et al. |
| 6,746,295 B2 | 6/2004 | Sorg |
| 6,759,803 B2 | 7/2004 | Sorg |
| 6,796,698 B2 | 9/2004 | Sommers et al. |
| 6,800,500 B2 | 10/2004 | Coman et al. |
| 6,815,724 B2 | 11/2004 | Dry |
| 6,822,991 B2 | 11/2004 | Collins, III et al. |
| 6,831,303 B2 | 12/2004 | Dry |
| 6,834,963 B2 | 12/2004 | Kim et al. |
| 6,857,767 B2 | 2/2005 | Matsui et al. |
| 6,880,954 B2 | 4/2005 | Ollett et al. |
| 6,882,331 B2 | 4/2005 | Wu |
| 6,930,870 B2 | 8/2005 | Nobe et al. |
| 6,937,754 B1 | 8/2005 | Eguchi |
| 6,992,335 B2 | 1/2006 | Ohkawa |
| 6,995,348 B2 | 2/2006 | Bradley et al. |
| 7,009,165 B2 | 3/2006 | Hehemann et al. |
| 7,071,493 B2 | 7/2006 | Owen et al. |
| 7,102,172 B2 | 9/2006 | Lynch et al. |
| 7,179,670 B2 | 2/2007 | Shelton et al. |
| 2001/0002120 A1 | 5/2001 | Bessendorf et al. |
| 2001/0012047 A1 * | 8/2001 | Osawa et al. ................ 347/241 |
| 2001/0030782 A1 | 10/2001 | Trezza |
| 2001/0046652 A1 | 11/2001 | Ostler et al. |
| 2002/0187454 A1 | 12/2002 | Melikechi et al. |
| 2003/0038943 A1 | 2/2003 | Almarzouk et al. |
| 2003/0043582 A1 | 3/2003 | Chan et al. |
| 2003/0081096 A1 | 5/2003 | Young |
| 2003/0209714 A1 | 11/2003 | Taskar et al. |
| 2003/0230765 A1 | 12/2003 | Dry |
| 2004/0000677 A1 | 1/2004 | Dry |
| 2004/0011457 A1 | 1/2004 | Kobayashi et al. |
| 2004/0026721 A1 | 2/2004 | Dry |
| 2004/0041521 A1 | 3/2004 | Mandler et al. |
| 2004/0057873 A1 | 3/2004 | Yerazunis |
| 2004/0090794 A1 | 5/2004 | Ollett et al. |
| 2004/0113549 A1 | 6/2004 | Roberts et al. |
| 2004/0119084 A1 | 6/2004 | Hsieh et al. |
| 2004/0134603 A1 | 7/2004 | Kobayashi et al. |
| 2004/0135159 A1 | 7/2004 | Siegel |
| 2004/0141326 A1 | 7/2004 | Dry |
| 2004/0166249 A1 | 8/2004 | Siegel |
| 2004/0195947 A1 | 10/2004 | Clark et al. |
| 2004/0201995 A1 | 10/2004 | Galli |
| 2004/0206970 A1 | 10/2004 | Martin |
| 2004/0238111 A1 | 12/2004 | Siegel |
| 2005/0087750 A1 | 4/2005 | Braddell et al. |
| 2005/0098299 A1 | 5/2005 | Goodson et al. |
| 2005/0152146 A1 | 7/2005 | Owen et al. |
| 2005/0230600 A1 | 10/2005 | Olson et al. |
| 2005/0231713 A1 | 10/2005 | Owen et al. |
| 2005/0253252 A1 | 11/2005 | Owen et al. |
| 2005/0285129 A1 | 12/2005 | Jackson et al. |
| 2006/0216865 A1 | 9/2006 | Owen et al. |
| 2007/0051964 A1 | 3/2007 | Owen et al. |
| 2007/0154823 A1 | 7/2007 | Marson et al. |
| 2007/0278504 A1 | 12/2007 | Jasmin et al. |

FOREIGN PATENT DOCUMENTS

| | | |
|---|---|---|
| DE | 10127171 A1 | 12/2001 |
| EP | 0146998 | 7/1985 |
| EP | 0879582 A1 | 11/1998 |
| EP | 0935145 | 8/1999 |
| EP | 1158761 | 11/2001 |
| EP | 1158761 A1 | 11/2001 |
| EP | 1467416 | 10/2004 |
| EP | 1469529 | 10/2004 |
| EP | 1502752 | 2/2005 |
| EP | 1526581 | 4/2005 |
| GB | 2224374 | 5/1990 |
| GB | 2396331 | 6/2004 |
| GB | 2399162 | 9/2004 |
| JP | 2003268042 | 9/2003 |
| JP | 2004-198536 | 7/2004 |
| JP | 2004-297052 | 10/2004 |
| WO | 9507731 A1 | 3/1995 |
| WO | 9716679 | 5/1997 |

(56) References Cited

FOREIGN PATENT DOCUMENTS

| WO | 0037904 | | 6/2000 |
|---|---|---|---|
| WO | 0059671 | A1 | 10/2000 |
| WO | 0067048 | A2 | 11/2000 |
| WO | 0102846 | | 1/2001 |
| WO | 0206723 | | 1/2002 |
| WO | 0211640 | A2 | 2/2002 |
| WO | 0213231 | | 2/2002 |
| WO | 0213231 | A2 | 2/2002 |
| WO | 0226270 | | 4/2002 |
| WO | 03023875 | A2 | 3/2003 |
| WO | 03096387 | | 11/2003 |
| WO | 2004009318 | | 1/2004 |
| WO | 2004011848 | | 2/2004 |
| WO | 2004038759 | | 5/2004 |
| WO | 2004049462 | | 6/2004 |
| WO | 2004078477 | | 9/2004 |
| WO | 2004084316 | | 9/2004 |
| WO | 2004097516 | | 11/2004 |
| WO | 2004097947 | | 11/2004 |
| WO | 2004100343 | | 11/2004 |
| WO | 20051089477 | | 3/2005 |
| WO | 2005036054 | | 4/2005 |
| WO | 2005041632 | | 5/2005 |
| WO | 2005043598 | | 5/2005 |
| WO | 2005043954 | | 5/2005 |
| WO | 2005091392 | | 9/2005 |
| WO | 2005094390 | | 10/2005 |
| WO | 2005100961 | | 10/2005 |
| WO | 2005101535 | | 10/2005 |
| WO | 2006072071 | | 7/2006 |

OTHER PUBLICATIONS

Supplemental European Search Report and Written Opinion for European Application No. EP03724539, dated Nov. 21, 2007, 8 pages.
PCT International Search Report and Written Opinion for International Application No. PCT/US04/36046, dated Jun. 7, 2006, 6 pages.
Electromagnetic Spectrum, http://www.brocku.ca/earthsciences/people/gfinn/optical/spectrum.gifprinted Aug. 16, 2006, 1 page.
PCT International Search Report and Written Opinion for International Application No. PCT/US05/13448, dated Oct. 13, 2006, 8 pages.
PCT International Search Report and Written Opinion for International Application No. PCT/US05/11216, dated Sep. 28, 2006, 9 pages.
PCT International Search Report and Written Opinion for International Application No. PCT/US05/09076, dated Oct. 16, 2006, 10 pages.
PCT International Search Report and Written Opinion for International Application No. PCT/US04/36260, dated Jun. 3, 2005, 5 pages.
PCT International Search Report and Written Opinion for International Application No. PCT/US04/36370, dated Jun. 17, 2005, 6 pages.
PCT International Search Report and Written Opinion for International Application No. PCT/US05/09407, dated Aug. 26, 2005, 11 pages.
PCT International Search Report and Written Opinion for International Application No. PCT/US05109407, dated Sep. 28, 2006, 9 pages.
PCT International Search Report and Written Opinion for International Application No. PCT/US05/12608, dated Feb. 6, 2007, 8 pages.
PCT International Search Report and International Preliminary Examination Report for International Application No. PCT/US03/14625, dated Nov. 19, 2003, 6 pages.
Siegel, S., Curing with UV LED's—Abstract Only, IS&T's NIP19: 2003 International Conference on Digital Printing Technologies, p. 365.
Data Sheet for G*SiC Technology Super Blue LEDs No. C430-CB290-E1200, manufactured by Opto Semiconductors, May 1, 1999, 8 pages.
Data Sheet for 5.0 mm Blue Series LEDs No. LNG992CFB, manufactured by the Panasonic Corporation, Mar. 2001, 1 page.
Data Sheet for 3.0 mm Blue Series LEDs No. LNG997CKB, manufactured by the Panasonic Corporation, Mar. 2001, 1 page.

* cited by examiner

MICRO-REFLECTORS ON A SUBSTRATE FOR HIGH-DENSITY LED ARRAY

CROSS-REFERENCE TO RELATED APPLICATIONS

This application is a divisional of U.S. patent application Ser. No. 11/084,466, filed Mar. 18, 2005, which claims the benefit of U.S. Provisional Patent Application No. 60/554,628, filed Mar. 18, 2004, all of which are hereby incorporated by reference herein in their entirety.

BACKGROUND OF THE INVENTION

This invention relates to high-density light emitting diode (LED) arrays and, more particularly, to an LED array that has improved collection and collimation of light.

High-density UV LED arrays may be used for a variety of applications, including, e.g., curing applications ranging from ink printing to the fabrication of DVDs and lithography. Many such applications require a high optical power density at the working surface. However, such power density tends to be unavailable from a typical LED as such LED alone generally is characterized by light distribution that is undesirably divergent.

For example, FIG. 1 is a graphic illustration showing radiation distribution for two typical LEDs 22, 24 mounted on a surface 26 without refractive or reflective optics. Ideally, particularly for applications as above described, the light from the LEDs 22, 24 would be distributed substantially 90 degrees from substrate 26. However, the LEDs 22, 24 will typically emit highly divergent light. In FIG. 1, this is illustrated by curves 28 and 30. Curve 28 is a representative example of radiation distribution from first LED 22 and curve 30 is a representative example of radiation distribution from second LED 24. Because much of radiation from LEDs 22, 24 is emitted at highly oblique angles, the optical power density falls off relatively quickly as a function of the distance of the work surface from the LED. This fall off is graphically illustrated in FIG. 2 for an LED array without refractive or reflective optics.

Typically, the performance illustrated by FIGS. 1 and 2 may vary as the system is changed. For example, the performance would tend to vary if different LEDs are used and if the LEDs are placed in different arrays (e.g., depending on the number and spacing of LEDs in the array). In any case, particularly for the aforementioned applications, divergence and fall off similar to that illustrated by FIGS. 1 and 2 will tend to be undesirable.

To achieve the optical power density typically required in the aforementioned applications, an LED array exhibiting such divergence could and often is located physically close to the work surface. That is, the proximity of the array to the work surface would be closer than if the array did not exhibit such divergence. Moreover, such close proximity generally is undesirable, including because it will typically necessitate mechanical changes to tooling and/or shielding to accommodate such proximity. However, locating the LED array too far from the work surface may diminish the optical power density to undesired levels, which levels may hinder or preclude proper operation in the application.

There are known methods of achieving higher optical power density. For example, some LEDs are used with Lambertian optical outputs to achieve a higher optical power density. However, such devices are less efficient in electrical to optical conversions as well as being less thermally efficient. Another method of achieving higher optical power density is shown if FIG. 3 in which an array of refractive optical elements 32 is located above an array of LEDs 34 in which each LED 34 is associated with an optical element 32. Each optical element 32 collects and collimates the light from its associated LED 34. However, this method is inefficient because light from LEDs is highly divergent causing much of the light to fall outside the numerical aperture of the lenses. The numerical aperture of a lens is defined as the sine of the angle between the marginal ray (the ray that exits the lens system at its outer edge) and the optical axis multiplied by the index of refraction (n) of the material in which the lens focuses. In order to more effectively collect and collimate the light the optical component must have a very high numerical aperture resulting in a lens that has a very large diameter and a very short focal length. In practice, it is not possible to manufacture a refractive optical element that collects all of the light from an LED because that would require the angle between the optical axis and the marginal ray to be 90 degrees, implying a lens of either a zero focal length or an infinite diameter.

Another common approach to collecting and collimating light from an LED is to use a parabolic reflector as shown in FIG. 4. AN LED 36 is mounted in parabolic reflector 38 so that light rays 40 emitted from LED 36 are collected and collimated. Unlike refractive optics, reflective optics generally collect all the light from the LED, even at very highly oblique angles. However, known reflective optics are not used in a tightly packed or dense array because of their size. For example, a typical application of such reflective optics is with LED-mounted flashlights in which the reflective optic collimates light from only a single LED.

Additionally, in known optical devices the reflector is separate from the electrical circuitry of the device. For example, such devices typically utilize a macro-reflector for an entire array of LEDs. The optical efficiency of these devices is lowered because each LED does not have an associated reflector. Additionally, the volume of space required for the macro-reflector is very large which increases the cost of manufacturing.

SUMMARY OF THE INVENTION

The present invention provides an LED array using micro-reflectors. The micro-reflectors, generally, collect and collimate light from the LED array. In doing so, the micro-reflectors enhance the array's optical power. In typical applications, the LED array benefits from such enhanced optical power in that it may be physically located further away from a work surface and yet deliver optical power sufficient to enable proper operation.

In one aspect, the present invention provides a dense LED array in which each LED of such array is mounted in a micro-reflector. Accordingly, an array of micro-reflectors. The micro-reflectors typically are formed in a substrate. Preferably, the substrate is of a material that is electrically insulating. Preferably, the substrate is also thermally conductive.

In one embodiment, the substrate is a crystalline silicon having defined crystallographic axes along which the substrate is etched to form openings in the substrate. These openings have walls with a characteristic slope, so as to have a substantially truncated pyramidal shape. The openings are metallized and otherwise structured to define selected circuits. The resulting substrate has openings formed in a dense array, which openings are coated with a reflective material so that the openings function as micro-reflectors. Preferably, the reflective material is also electrically conductive so that the openings also function as electrical connectors (e.g., if coupled to power or to ground).

In this embodiment, one or more LEDs are mounted within each micro-reflector and wired into a circuit on the substrate. The LEDs of the array is electrically connected to a power source, with the micro-reflector preferably providing electrical connection to the associated LEDs (e.g., the reflector being coupled to either power or to ground).

The substrate may be formed of any size and the LEDs arranged in any desired dense configuration required for a particular application.

In another embodiment, a dense LED array is provided in which an array of micro-reflectors is formed using a substrate of other than silicon, such as an insulator, a semiconductor, a conductor, or combinations of one or more of these or other materials. As examples, the substrate may be glass, ceramic, diamond, SiC, AlN, BeO, Al2O3, or combinations of these or other materials.

Micro-reflectors may be formed using various technologies. As examples, the micro-reflectors may be formed using lithographical technology, machining, stamping, casting, forging, or other processes, or combinations of one or more of these. To illustrate, micro-reflectors may be machined into the substrate and/or otherwise formed (e.g., such machining via lasers and/or plasma). To further illustrate, micro-reflectors may be formed by a combination of etching, together with machining or other technology. In this illustration, a substrate may be etched to form openings. Each opening is then machined to a desired shape, such as a parabolic shape. Such machining may be performed before or after the substrate, including the openings, is coated with a reflective material.

Micro-reflectors may be formed having various shapes. Generally, the shape is selected so as to optimize the optical power density. While parabolic micro-reflectors are typical, micro-reflectors may have other shapes. Moreover, the shapes may be varied within any particular array. As such, the micro-reflectors in the array may be patterned.

The present invention provides an array module that includes a plurality of semiconductor devices mounted on a substrate formed with a plurality of openings that function as micro-reflectors, wherein each semiconductor device or multiple devices is associated with a micro-reflector, each micro-reflector including a layer of reflective material to reflect light. Preferably, such reflective material is electrically conductive and coupled so as to provide electrical connection for its associated semiconductor device.

The present invention further provides a method of manufacturing an array module comprising the steps of providing a substrate, forming a plurality of openings in the substrate, providing a layer of reflective material in each opening, and mounting a semiconductor device within each opening so that the layer of reflective material in each opening reflects light. Preferably such material is electrically conductive and coupled so as to provide electrical connection for its associated semiconductor device.

The present invention provides for a method of manufacturing an array module in which a substrate is metallized. Metal circuits are structured on the metallized substrate and the substrate is then etched to form openings. The openings are then metallized to form micro-reflectors that reflect light (and, preferably, that provide electrical connection for an associated semiconductor device). This enables the formation of features in the electrical circuit separately from the etching and plating tasks associated with forming the micro-reflectors.

The present invention further provides an optical device that incorporates a reflector into the electrical circuitry of the optical device so as to obtain higher optical efficiency with lower costs.

These and other embodiments are described in more detail in the following detailed descriptions and the figures.

The foregoing is not intended to be an exhaustive list of embodiments and features of the present invention. Persons skilled in the art are capable of appreciating other embodiments and features from the following detailed description in conjunction with the drawings.

DETAILED DESCRIPTION OF THE INVENTION

Figure 1:
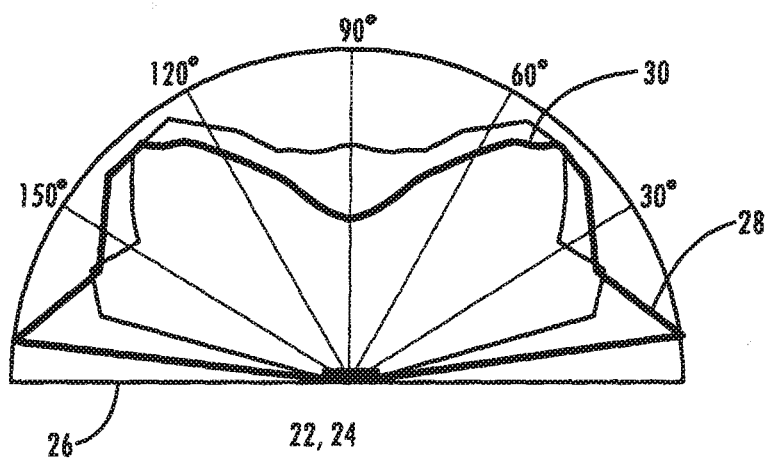
FIG. 1 shows radiation distribution for two LEDs without refractive or reflective optics.

Representative embodiments of the present invention are shown in FIGS. 5-14, wherein similar features share common reference numerals.

In a basic embodiment, an LED array employs micro-reflectors. The micro-reflectors, generally, collect and collimate light from the LED array. In doing so, the micro-reflectors enhance the array's optical power. In typical applications, the LED array benefits from such enhanced optical power in that it may be physically located further away from a work surface and yet deliver optical power sufficient to enable proper operation.

Figure 5:
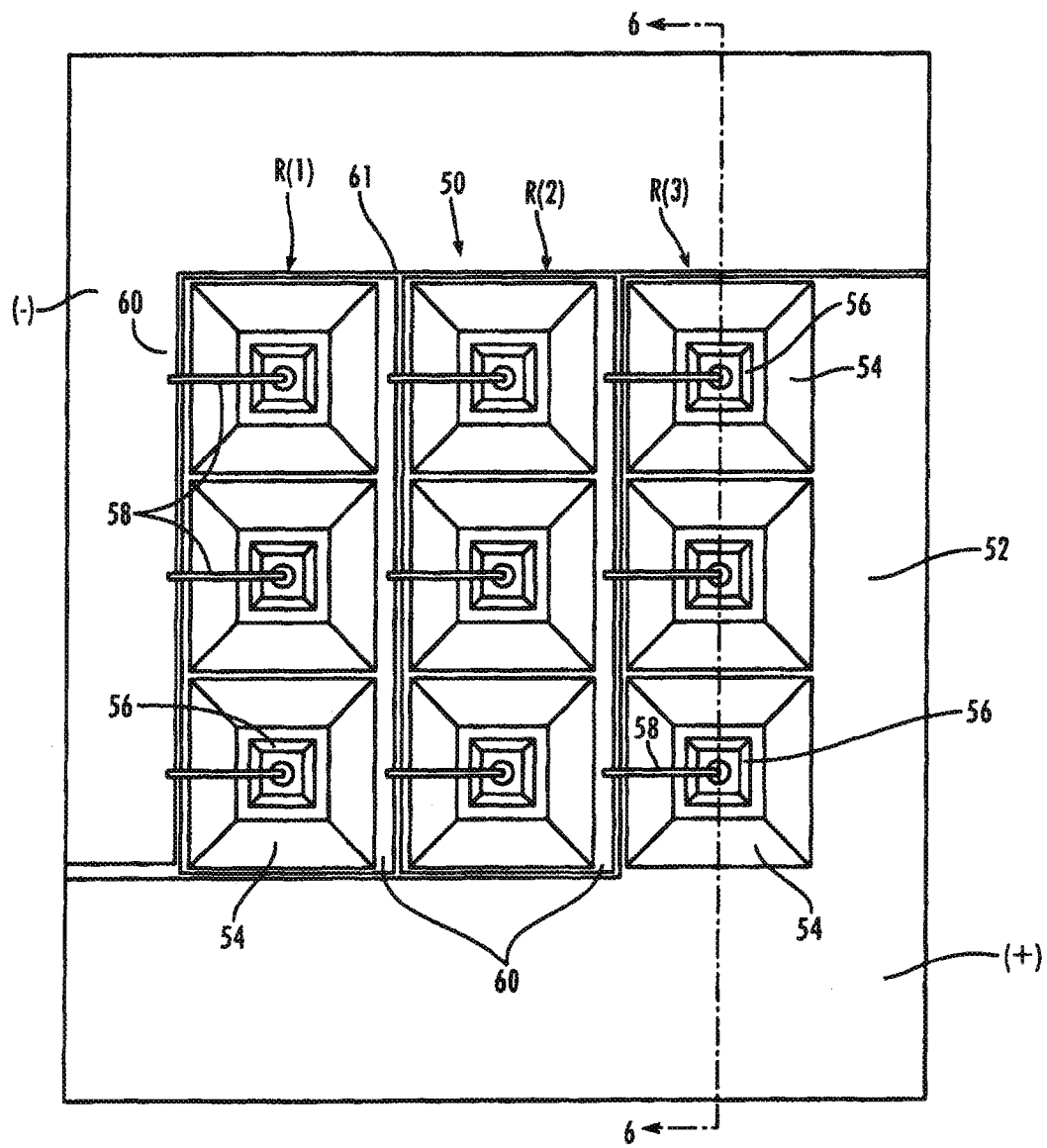
FIG. 5 is an enlarged top view of a portion of an LED array according to one aspect of the present invention.
Figure 6:
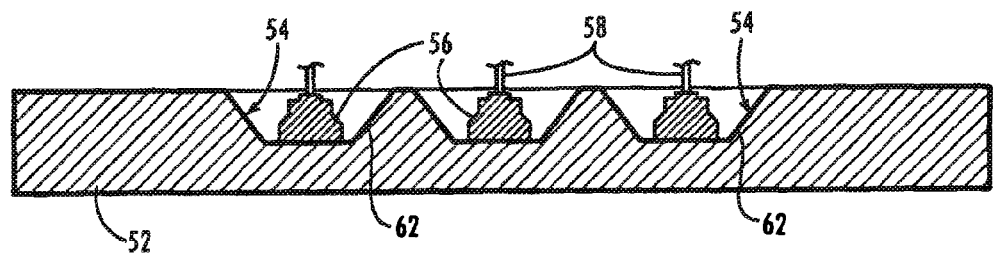
FIG. 6 is a view of the LED array of FIG. 5 taken along line 6-6.

FIG. 5 shows a portion of a dense LED array 50 that may be used for applications requiring high optical power density at the working surface. Such applications may include, for example, curing applications ranging from ink printing to the fabrication of DVDs and lithography. One such LED array is shown and described in U.S. patent application Ser. No. 10/984,589, filed Nov. 8, 2004, the entire contents of which are hereby incorporated by reference for all purposes.

Array 50 includes a substrate 52 having micro-reflectors 54 formed therein. An LED 56 is mounted within each micro-reflector 54 in a manner known by those skilled in the art. Although the figures show only one LED associated with a micro-reflector each micro-reflector may be associated in one or more LEDs, such as one of each red, green, and blue, or other colors, or any combination thereof. One type of LED suitable for use is a P/N C395-XB290-E0400-X, manufactured by Cree, Inc., located in Durham, N.C., USA.

Each LED 56 may be mounted using various technologies. The technologies include, as examples, bonding using a conductive adhesive, soldering, or eutectic bonding.

Each LED 56 is electrically connected to a power source (not shown) through a lead line 58 connected in a known manner to a wire bond pad 60 on substrate 52.

In this embodiment, each row R(1), R(2), R(3) is electrically isolated by an isolation band 61. It is to be understood, however, that the array may provide isolation on a basis other than by row. For example, each LED may be electrically isolated from all other LEDs in the array, or from the immediately surrounding LEDs (e.g., while being electrically connected with selected LEDs adjacent to such surrounding LEDs), or from some other selection of LEDs. In this way, electrically connected LEDs may be provided in a selected pattern throughout or in one or more parts of the array. This isolation/connection may be useful in controlling heating of the LED array, e.g., by selectively reducing power to, or even shutting down individual LEDs or one or more groups of the LEDs, so as to counter undesirable heating. Heating of LED arrays, and methods to handle such heating, including the selective control of power provided to one or more LEDs in such array, are shown and described in U.S. patent application titled "DIRECT COOLING OF LEDS," Ser. No. 11/083,525, filed Mar. 18, 2005, claiming priority to U.S. Provisional Application Ser. No. 60/554,632, filed Mar. 18, 2004, the entire contents of which application are hereby incorporated by reference for all purposes.

Each micro-reflector 54 includes a layer 62 of reflective and, preferably, electrically conductive material both to reflect light from and to complete a circuit to electrically connect (e.g., power) an associated LED 56. Various materials may be employed that are both optically reflective and electrically conductive and that can be bonded to electrically. As examples, these materials include copper, aluminum, gold, and silver, or combinations thereof or alloys therewith. This construction provides micro-reflectors 54 that reflect light from an associated LED 56 and that are incorporated into the conductive circuitry to provide electrically connection (e.g., to power) for an associated LED 56. Although it is preferred that the materials used to provide the micro-reflectors are used to both reflect and to provide electrical connection, it is understood that the materials may be used for only one such purpose, e.g., to reflect light, without departing from the principles of the invention.

Substrate 52 is preferably a 1-0-0 crystalline silicon wafer. This wafer has defined crystallographic axes that are determined by silicon's crystalline lattice. One of the consequences of silicon's crystalline nature is that etching of silicon can be made to progress preferentially along some crystallographic axes as compared to others. As a result, when the surface of a silicon wafer is properly oriented, masked to expose the surface to be etched, and placed in an etching solution (such as potassium hydroxide or hydrofluoric acid), openings are etched in the silicon having walls with a characteristic slope, typically of about 54.7 degrees.

Substrate 52 preferably is fabricated using a cleaned and polished 1-0-0 silicon wafer. The wafer surfaces generally are super cleaned to remove contamination. Known cleaning methods include a hydrofluoric acid soak followed by one or more aluminum hydroxide soaks, multiple dump rinses, and a distilled water spin rinse dry in heated dry nitrogen.

A layer (e.g., silicon nitride) is applied to the substrate 52 using generally understood methods, e.g., vapor deposition or plasma enhanced vapor deposition. This layer can be, for example, about 2,400 angstroms. This layer is then coated with photoresist. It is necessary to selectively remove photoresist from wafers prior to etching into the silicon. To do so, the photoresist imaged or exposed with a mask and selected portions of the photoresist are removed using an oxygen plasma (12 cc/min. oxygen flow at 360 watts) or resist stripper (such as Shipley 1112 A), followed by several distilled water rinses. By removing selected photoresist, portions of the substrate's surface are exposed where openings that will become the micro-reflectors are desired. In one embodiment, the silicon surface is prepared to expose a plurality of square shapes having sides measuring about 700 microns (0.028 in.) and spaced apart in a center-to-center spacing of about 800 microns (0.032 in.).

The exposed portions of the layer (e.g., silicon nitride) are then etched. Silicon nitride can be etched with buffered hydrofluoric acid (BHF), which will not attack silicon. An alternative to BHF is reactive ion etch (RIE). One example of the RIE for this application is to etch for 90 seconds at 150 watts and 50 standard cubic centimeters per minute Sulfur Hexafluoride ($SF_6$) at 100 mTorr vacuum. The silicon nitride openings are etched until the base silicon wafer is fully exposed and shiny.

The silicon is then etched. For example, potassium hydroxide (KOH) may be employed as a wet etch that attacks silicon preferentially in the 1-0-0 plane, producing a characteristic anisotropic V-etch with sidewalls that form about a 54.7 degree angle with the surface (35.3 degree from the normal). Adding 1 percent isopropyl alcohol to the KOH solution will lower the surface tension of the solution, typically resulting in smoother etched walls.

The speed of the etch can be adjusted by those skilled in the art. To illustrate, the etch rate can be about 750 angstroms per minute at room temperature using a potassium hydroxide (KOH) solution of 400 grams of KOH per liter of distilled water. At 52 degrees C. the etch rate is about 14 microns per hour.

In this etch process, the etch rate of the silicon nitride layer is about 300 times slower than the etch rate of the silicon. While this may provide sufficient control to protect the silicon nitride, it may be necessary to monitor and adjust the thickness of the silicon nitride layer to ensure that it is properly masking during the entire base silicon wafer etching.

Figure 7:
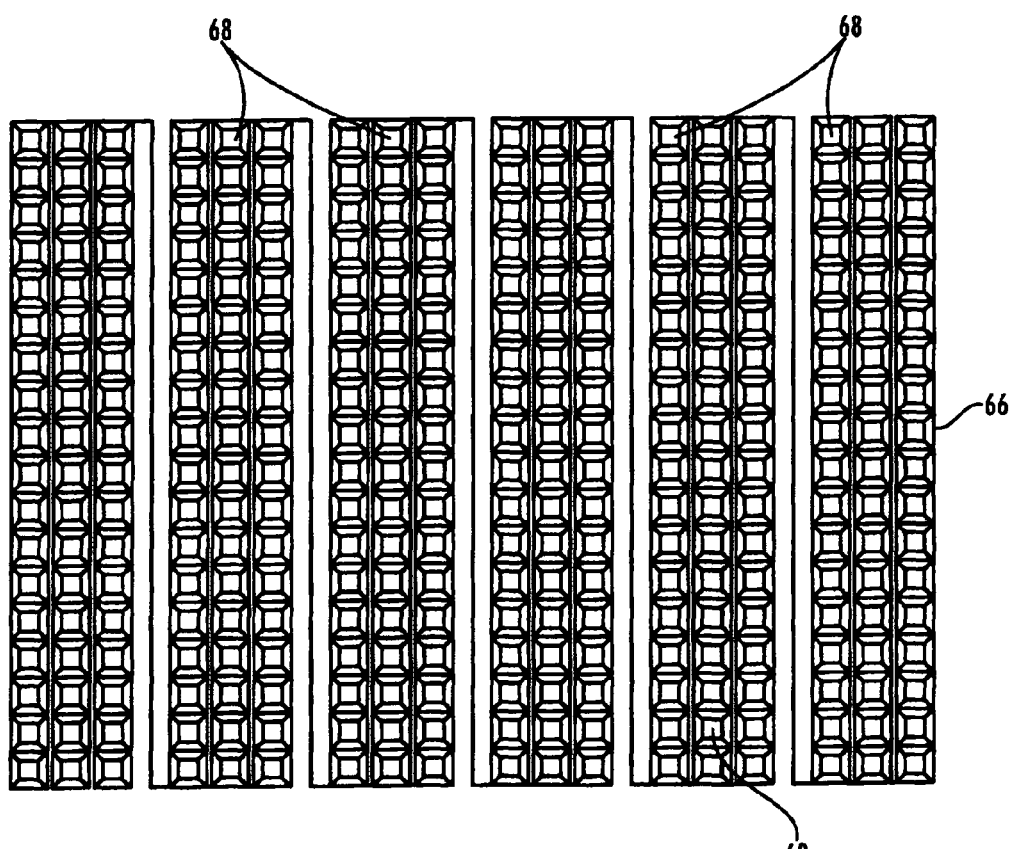
FIG. 7 is a top view of the substrate formed with an array of pockets according to one aspect of the invention.
Figure 8:
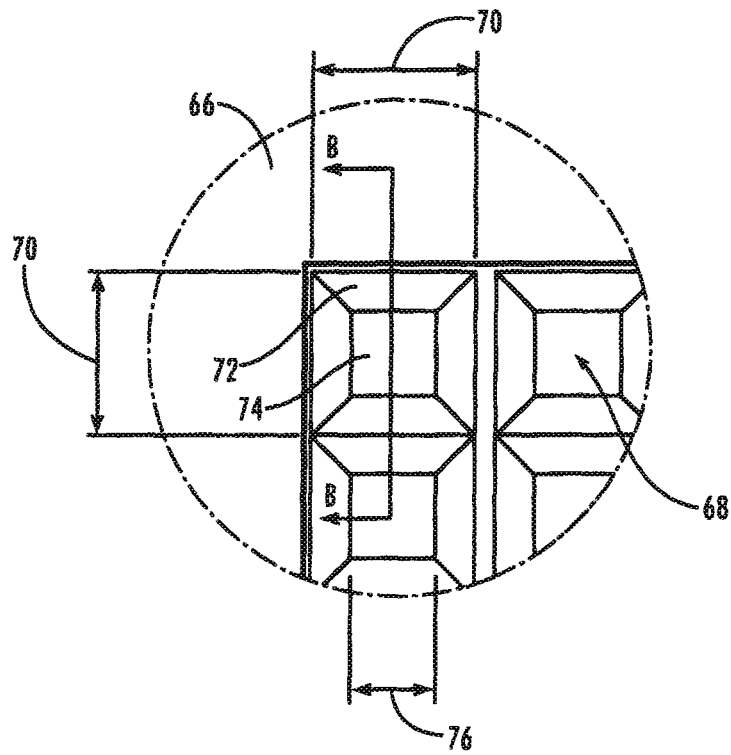
FIG. 8 is an enlarged partial top view of a portion of the substrate of FIG. 7.
Figure 9:
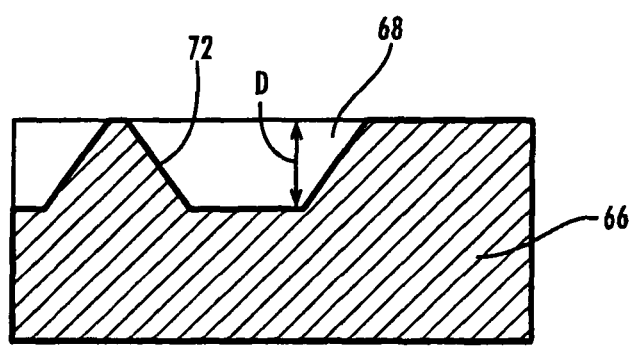
FIG. 9 is an enlarged partial side view of a portion of the substrate of FIG. 7.

The result is a substrate 66 as seen in FIGS. 7-9, having an array of openings 68. In this embodiment, openings 68 are arranged in a densely packed array in a center-to-center spacing of about 800 microns (0.032 in.). Each micro-reflector is formed in a truncated pyramidal shape in which opening 68 has sides having dimensions 70 of about 700 microns (0.028 in.) square. Openings 68 have sidewalls 72 that slope to a base 74 at an angle of about 54.7 degrees from a horizontal plane. Base 74 has a dimension 76 of about 346 microns (0.014 in.) square and openings have a depth (D) of about 250 microns (0.010 in.). These dimensions are merely illustrative and the invention is not limited to an optical device with these dimensions. For example, an optical device may be constructed and arranged so that the micro-reflectors have a center-to-center spacing of about 3 mm or less.

Substrate 52, including the openings 68, is then metallized. In doing so, typically several thin film layers are used. Preferably, the film layers are applied using generally understood methods, e.g., vapor deposition or plasma enhanced vapor deposition. Various layers and combinations of layers may be used. Generally, however, each such layer, and the layer combinations, are selected to address one or more various desirable performance characteristics, including as examples: to reflect light (including light of selected wavelength(s)), to provide electrical connection(s), to provide electrical insulation (including circuit isolation), to provide adhesion of the layers to the substrate, to combat metal migration, and to enhance mounting of the LED in the micro-reflector.

In one possible layer combination, a dielectric coating of about 1000 angstroms of silicon dioxide is applied to isolate the conductive circuit from the semiconductor. An adhesion layer of about 100-500 angstroms of titanium is then applied to improve adhesion of the metal layers. Next, a barrier metal layer of about 100-500 angstroms of nickel is applied to prevent metal migration between the layers. Then, a light reflecting and electrically conducting layer is applied to form both an optical reflector and an electrical circuit. For UV light, this layer can be about 1-10 microns of silver or aluminum and, for visible light, this layer can be about 1-10 microns of gold.

Another possible layer combination is to use 1,000 angstroms of silicon dioxide to isolate the conductive circuit followed by 1,000 angstroms of titanium to improve adhesion of the metal layers. A barrier layer of about 1,000 angstroms of nickel may be applied to prevent metal migration between the layers. Generally, it is not desirable to use heavy nickel layers where the tendency of the nickel is to cause peeling of the metal.

The nickel layer may then by coated with about 6 microns of silver to form the reflective and electrical conductive layer. The nickel and silver material constitute an electrical conductor enabling use of bonding techniques common to fabrication of semiconductor devices, e.g., wire bonding, such as with Au, Ag, Al, thermal adhesives and soldering processes. The heavy silver layer also helps to carry relatively high electrical currents, so as to optimize optical power generation, particularly of UV light. Although it is preferred that the materials used to provide the micro-reflectors are used to both reflect and to provide electrical connection, it is understood that the materials may be used for only one such purpose, e.g., to reflect light, without departing from the principles of the invention.

After the metallization process described above, isolation band 61 is formed so as to form the electrical circuits on the metallized substrate. There are various known methods generally to provide electrical isolation among selected circuit elements or, specifically, to form isolation band 61 to form circuits on metallized substrates. In one example, the isolation is provided via subtractive techniques to remove selected portions of the metal and thereby electrically isolate various circuit elements. In this example, a laser processes may be employed to cut through the selected portion(s) of the metal and, typically, slightly into the silicon. As well, photolithographic processes may be used (e.g., including using photoresist, masking, developing, and etching, such as via a wet or plasma etch) to remove the selected portion(s) of the metal. While the laser processes tend to be flexible and relatively easy to change/adjust as to locations and geometries, the photolithographic process uses existing, well-understood and typically cost-effective fabrication systems. Generally, any of these or other process, alone or in combination, will be suitable.

Generally, one or more LEDs are mounted within each micro-reflector and electrically connected. The LEDs are electrically connected to a power source. Preferably, each micro-reflector provides electrical connection to its associated LEDs (e.g., the reflector being coupled to either power or to ground). Such connection is enabled by use of the metal layers (as described above). In doing so, the metal layers provide a source (or return) electrode. The LEDs typically are also electrically connected to an other feature that provides a return (or source) electrode, so as to complete an electrical circuit. As example this other feature may be the wire bond pad 60 on the surface of the substrate, connected via lead line 58, as described above with reference to FIGS. 5 and 6. In the alternative, this other feature may be provided by the substrate or other material providing the base of the micro-reflector. In such alternative, particularly if the reflective metal layer(s) of the micro-reflector are an electrode, the substrate (and/or other material) is electrically isolated from the associated metal layers of the micro-reflector using one or more appropriate dielectric layers. Moreover, if the micro-reflector is formed in an opening fabricated within a material applied above the substrate (such that the base of the micro-reflector is outside the substrate), that material may provide the other electrode with or without using the substrate in making the return (or source) connection (e.g., the electrical connection may be made via the substrate or via conductive features fabricated on the substrate).

Metallization on the back of the silicon provides for solder attach of, e.g., a supporting structure (not shown), a heat sink (not shown), and/or other circuitry (not shown). The metallization may be a heavy silver layer. This silver layer can be replaced by a flash of gold to protect the nickel. The flash of gold keeps the nickel from oxidizing for improved solderability. The gold will go into solution in the solder. Minimizing the gold thickness will minimize cost while ensuring solderability and will minimize gold embrittlement potential in the solder joint connection between the substrate and, e.g., the supporting structure. Once the substrate has been fully processed the LEDs are mounted and bonded in a known manner (discussed above) to complete the LED array.

Figure 2:
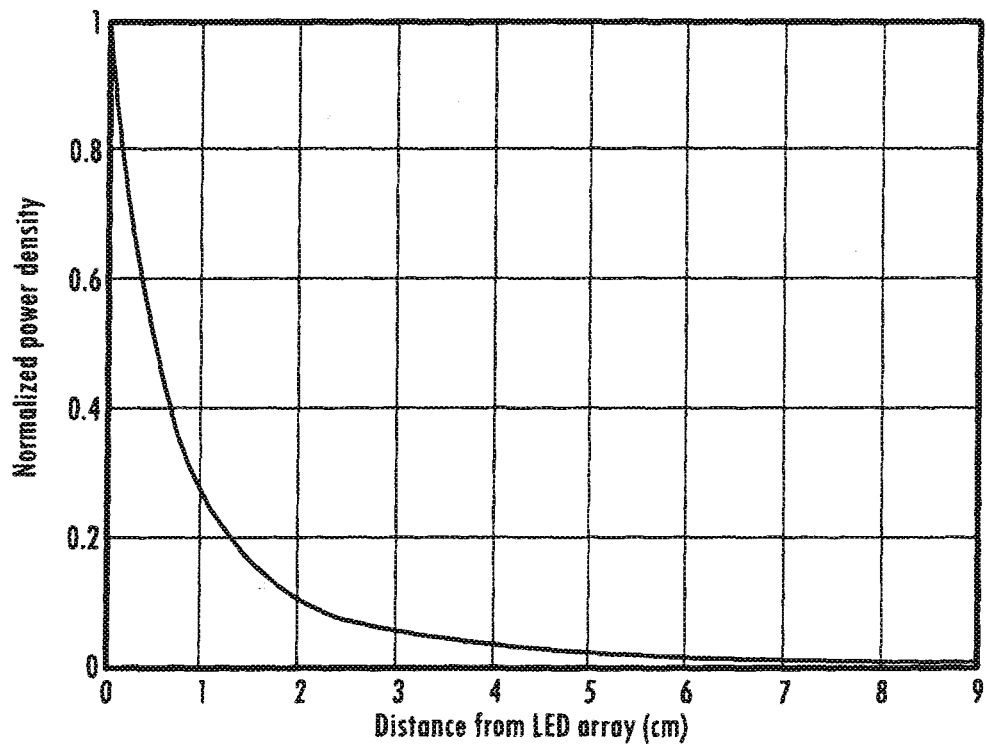
FIG. 2 shows a graph of an example of power drop-off as a function of distance from the LED array for a specific array.
Figure 3:
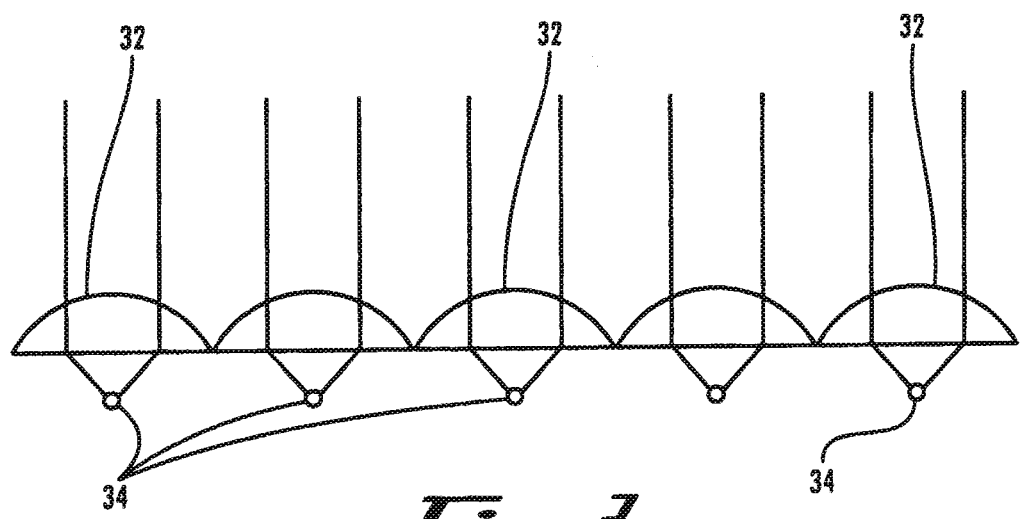
FIG. 3 shows an example of prior art refractive lenses used to collect and collimate light from an array of LEDs.
Figure 4:
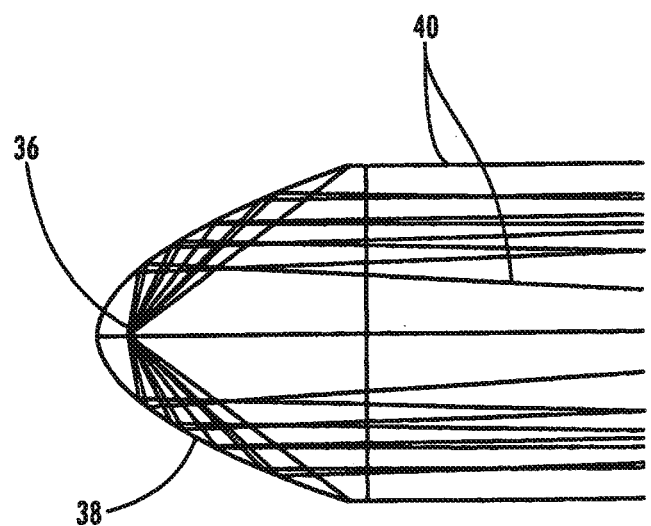
FIG. 4 shows a common approach of collecting and collimating light from an LED with a parabolic reflector.
Figure 10:
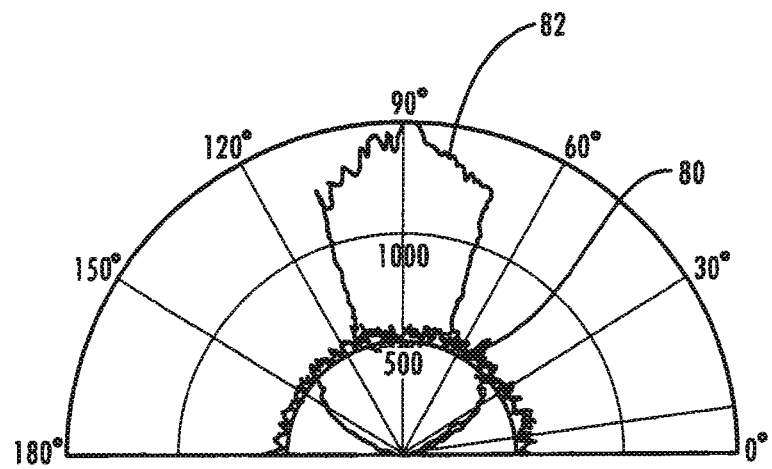
FIG. 10 is a graphic illustration showing the improved directionality of light from an LED with reflective pockets of the substrate of the invention.
Figure 11:
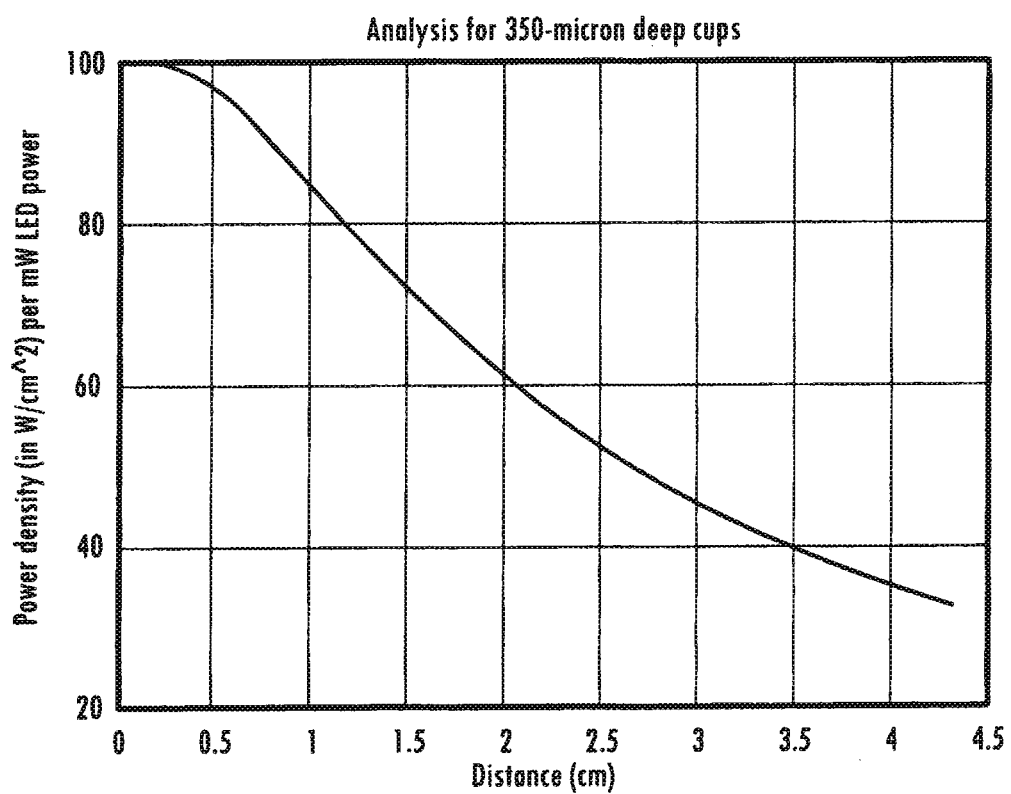
FIG. 11 is a graph of calculated power as a function of distance for an LED array arranged on a grid with 1 mm center-to-center spacing.

The LED array 50, employing micro-reflectors, provides improved collection and collimation of light emitted from the LEDs. FIG. 10 shows a graphic illustration of improved directionality in which curve 80 represents a generalized angular irradiance distribution of an LED without the use of optics (see also FIG. 1). Curve 82 represents the angular distribution of an LED after mounting into a micro-reflector formed by anisotropic etching 350 microns deep in a silicon substrate. FIG. 11 is a graphic illustration showing the calculated power as a function of distance for an array of LEDs mounted in the substrate arranged in a grid with a 1 mm center-to-center spacing. As seen by comparing the graphic illustrations of FIG. 2 and FIG. 11, the optical power density of an LED array absent micro-reflectors drops by about 50% at a distance of only about 0.5 cm (FIG. 2), whereas the optical power density of an LED array employing micro-reflectors drops by about 50% at a distance of about 2.6 cm (FIG. 11). Accordingly, an LED array employing micro-reflectors (as described herein) typically can be located relatively further away from a work surface than can an LED array without such micro-reflectors, while maintaining a substantially equivalent optical power density and, thus, enabling proper performance, particularly in certain applications.

Figure 12:
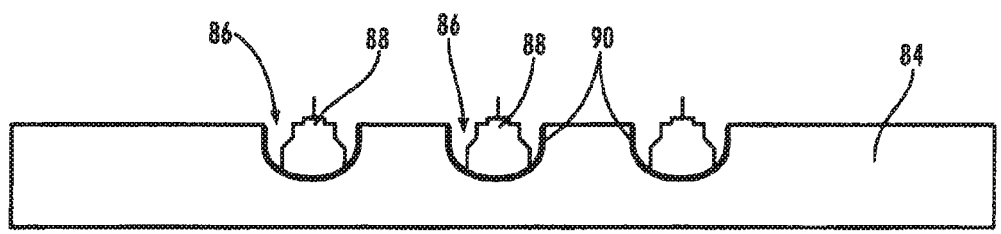
FIG. 12 is an alternative embodiment of the invention with parabolic micro-reflectors.

Micro-reflectors may be formed having various shapes. Generally, the shape is selected so as to optimize the optical power density. While parabolic micro-reflectors are typical, micro-reflectors may have other shapes. Moreover, the shapes may be varied within any particular array. As such, the micro-reflectors in the array may be patterned. To illustrate, the etched micro-reflectors in FIGS. 7-9 are shown having an inverted truncated pyramidal shape. However, FIG. 12 shows a substrate 84 formed with an array of micro-reflectors 86 having a parabolic shape. AN LED 88 is mounted in each micro-reflector as discussed above so that light from each LED 88 is reflected by layer 90. Layer 90 preferably is both a reflective and electrically conductive layer as discussed above.

The substrate may be formed of any size and the LEDs arranged in any desired dense configuration required for a particular application.

A dense LED array is also contemplated in which an array of micro-reflectors is formed using a substrate of other than silicon. Such substrate may be an insulator, a semiconductor, a conductor, or combinations of one or more of these or other materials. As examples, the substrate may be glass, ceramic, plastic, diamond, SiC, AlN, BeO, Al2O3, or combinations of these or other materials. Preferably, the substrate provides for formation of micro-reflectors, either formed in or on its surface, or some combination of both.

Micro-reflectors may be formed using various technologies. As examples, the micro-reflectors may be formed using lithographical technology, machining, stamping, casting, forging, or other processes, or combinations of one or more of these. To illustrate, micro-reflectors may be formed by machining openings (e.g., via lasers and/or plasma). To further illustrate, micro-reflectors may be formed by a combination of etching, together with machining or other technology. In this further illustration, a substrate is etched to form openings. Each opening is then machined to a desired shape, such as a parabolic shape. Such machining may be performed before or after the substrate, including the openings, is coated with a reflective material.

Figure 13:
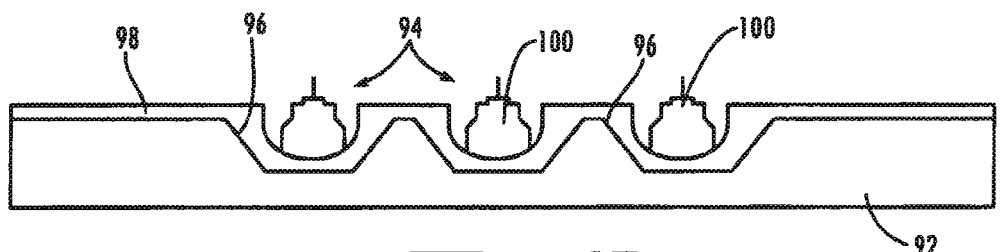
FIG. 13 is yet another embodiment of the invention in which the micro-reflectors are formed by a combination of etching and machining.

FIG. 13 shows an embodiment in which a plurality of micro-reflectors may be formed by a combination of etching and other processing. Substrate 92 is formed with a plurality of micro-reflectors 94 wherein substrate 92 is first etched to form openings 96 in a manner discussed above with reference to FIGS. 7-9. A layer of reflective (and, preferably, electrically conductive) material 98 is applied to substrate 92, including in the openings 96. The openings 96 are then processed, e.g., machined, so as to have a selected shape or shapes. As shown, the shapes are parabolic, but it is understood that other shape(s) may be employed (e.g., faceted). Additional metallization layers may then be applied (e.g., if machining removes undesirable amounts of metal). Further processing of the openings 96 may be performed (e.g., stamping to form the desired shape(s) within the openings 96). In doing such additional processing after the etching operation, not only are the micro-reflectors 94 are formed, but also the achievement of the desired shape(s) of such reflectors tends to be enhanced. A plurality of LEDs 100 are then mounted within the micro-reflectors 94 in the manner discussed above.

Although this description focuses on forming openings disposed in a selected substrate, it should be understood that a selected material may be layered on the surface of the substrate and openings may be formed in such material, without entering the substrate. It is also contemplated that the openings may be formed in such material, while yet entering the substrate.

Figure 14:
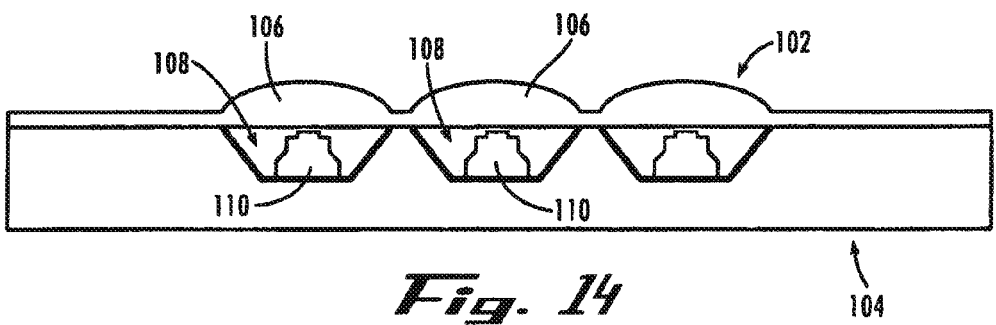
FIG. 14 is another embodiment of the invention incorporating an array of micro-lenses.

In another embodiment as seen in FIG. 14, directionality of light can be further improved by molding or aligning a microlens array 102 over an LED array 104 similar to those of FIGS. 7-9, 12, and 13. In this embodiment, each microlens 106 is associated with a micro-reflector 108 to further collect and collimate light from an associated LED 110. One type of microlens array is shown and described in PCT Appl. No. PCT/US04/36370, filed Nov. 1, 2004, the contents of which are hereby incorporated by reference in its entirety for all purposes.

The present invention provides for a method of manufacturing an array module in which a substrate is metallized. Electrical circuits are structured on the metallized substrate and the substrate is etched to form openings. The openings are metallized to form micro-reflectors that reflect light (and, preferably, that provide electrical connection for an associated semiconductor device). This enables the formation of features in the electrical circuit separately from the etching and plating tasks associated with forming the micro-reflectors.

Persons skilled in the art will recognize that many modifications and variations are possible in the details, materials, and arrangements of the parts and actions which have been described and illustrated in order to explain the nature of this invention and that such modifications and variations do not depart from the spirit and scope of the teachings and claims contained therein.

The invention claimed is:

1. A method for an optical array module, comprising:
providing a substrate,
forming a plurality of openings in the substrate,
providing a 1-10 micron layer of conductive, reflective material in each opening, and
mounting a semiconductor device that emits highly divergent light in a hemispherical radiation pattern within each opening wherein the layer of conductive, reflective material in each opening reflects light from its associated semiconductor device, and wherein the conductive, reflective material electrically connects the semiconductor device to a power source.

2. The method of claim 1, wherein the openings in the substrate are formed by an anisotropic crystallographic etching process.

3. The method of claim 2, wherein the anisotropic crystallographic etching process is performed along a 1-0-0 crystalline silicon axis.

4. The method of claim 2, wherein each micro-reflector is formed in a truncated pyramidal shape.

5. The method of claim 1, wherein the openings in the substrate are formed by a machining process.

6. The method of claim 5, wherein the openings have a parabolic shape.

7. The method of claim 1, wherein the openings are formed in an array having a center-to-center spacing of about 800 microns (0.032 in.).

8. The method of claim 1, wherein the substrate is formed from one of silicon, SiC, diamond, AlN, Al2O3, or BeO.

9. The method of claim 1, wherein each semiconductor device has a height and each opening has a depth, the height of each semiconductor device being substantially equal to the depth of each opening.

10. The method of claim 1, further comprising depositing a dielectric layer and a titanium metal adhesion layer in that order on the substrate prior to depositing the conductive, reflective layer.

11. The method of claim 1, further comprising depositing a nickel metal barrier layer on the substrate prior to depositing the conductive, reflective layer.

12. The method of claim 1, wherein mounting the semiconductor device comprises eutectic bonding the semiconductor device.

13. A method for an LED micro-reflector array, comprising:
forming a plurality of recesses in a substrate;

providing a dielectric layer, a metal adhesion layer, and a barrier metal layer, in that order, on the substrate;

providing an electrically conductive and optically reflective layer on the barrier metal layer; and mounting a semiconductor device that emits highly divergent light in a hemispherical radiation pattern within each recess wherein the electrically conductive and optically reflective layer in each recess reflects light from the corresponding semiconductor device, and wherein the electrically conductive and optically reflective layer electrically connects the semiconductor device to a power source.

14. The method of claim 13, wherein a thickness of the electrically conductive and optically reflective layer is 1 micron or more and 10 microns or less.

* * * * *